US007286016B2

(12) United States Patent
Svechtarov et al.

(10) Patent No.: US 7,286,016 B2
(45) Date of Patent: Oct. 23, 2007

(54) AMPLIFIER BIAS CIRCUIT, METHOD FOR BIASING AN AMPLIFIER AND INTEGRATED CIRCUIT COMPRISING AN AMPLIFIER BIAS CIRCUIT

(75) Inventors: Jordan Konstantinov Svechtarov, Nijmegen (NL); Josephus Henricus Bartholomeaus Van Der Zanden, Nijmegen (NL)

(73) Assignee: NXP B.V., Eindhoven (NL)

( * ) Notice: Subject to any disclaimer, the term of this patent is extended or adjusted under 35 U.S.C. 154(b) by 247 days.

(21) Appl. No.: 10/532,929

(22) PCT Filed: Sep. 22, 2003

(86) PCT No.: PCT/IB03/04235

§ 371 (c)(1),
(2), (4) Date: Apr. 27, 2005

(87) PCT Pub. No.: WO2004/040750

PCT Pub. Date: May 13, 2004

(65) Prior Publication Data

US 2006/0087377 A1    Apr. 27, 2006

(30) Foreign Application Priority Data

Oct. 30, 2002   (EP) .................. 02079547

(51) Int. Cl.
*H03F 3/16* (2006.01)
(52) U.S. Cl. ...................... 330/289; 330/296

(58) Field of Classification Search ............... 330/285
See application file for complete search history.

(56) References Cited

U.S. PATENT DOCUMENTS

| 5,113,068 | A | * | 5/1992 | Burke, Jr. ............... 250/214 B |
| 5,192,919 | A | * | 3/1993 | Wieczorek ................ 330/129 |
| 5,272,452 | A | * | 12/1993 | Adachi et al. ............. 331/17 |
| 6,008,698 | A | * | 12/1999 | Dacus et al. ............. 330/279 |
| 6,288,596 | B1 | | 9/2001 | Johnsson et al. |
| 6,313,705 | B1 | * | 11/2001 | Dening et al. ............. 330/276 |
| 6,344,775 | B1 | | 2/2002 | Morizuka et al. |
| 6,720,831 | B2 | * | 4/2004 | Dening et al. ............. 330/298 |
| 6,774,724 | B2 | * | 8/2004 | Krvavac ................... 330/296 |
| 6,778,018 | B2 | * | 8/2004 | Joly et al. ................. 330/296 |
| 6,825,725 | B1 | * | 11/2004 | Doherty et al. ............ 330/289 |
| 6,922,107 | B1 | * | 7/2005 | Green ...................... 330/296 |
| 2001/0013811 | A1 | | 8/2001 | Morohashi et al. |

* cited by examiner

*Primary Examiner*—Benny Lee
*Assistant Examiner*—Alan Wong
(74) *Attorney, Agent, or Firm*—Peter Zawilski

(57) ABSTRACT

An amplifier bias circuit connectable to an amplifier device, comprising a first sensor device for sensing a first amplifier characteristic and for providing at a first sensor output a bias signal related to the first amplifier characteristic. The circuit further comprises a second sensor device for sensing a second amplifier characteristic and for providing at a second sensor output a bias signal related to the second amplifier characteristic. The first sensor output and second sensor output are each connected to an amplifier connect connectable to a bias input of said amplifier device.

18 Claims, 2 Drawing Sheets

AMPLIFIER BIAS CIRCUIT, METHOD FOR BIASING AN AMPLIFIER AND INTEGRATED CIRCUIT COMPRISING AN AMPLIFIER BIAS CIRCUIT

The invention relates to an amplifier bias circuit, a method for biasing an amplifier and an integrated circuit comprising an amplifier bias circuit.

For amplifier devices, such as for example field effect transistors, the characteristics are preferred to be as stable as possible. Especially, stability during the lifetime of the device and under differing environmental conditions is preferred. However, all known amplifiers have unstable characteristics which may for example change during the amplifier lifetime and/or under different environmental conditions.

For example, in a field effect transistor (FET) the drain quiescent current degrades during the lifetime of the transistor. The degradation is in particular present in the insulated gate field effect transistor (IGFET), such as the laterally diffused metal oxide semiconductor field effect transistor (LDMOSFET). This degradation of the drain quiescent current is caused by injection in the drain area of charge carriers with high energies, called hot charge carriers. The degradation causes uncontrolled changes in the device performance, especially in terms of linearity of the device characteristics. Furthermore, in a FET the drain quiescent current is temperature dependent. Especially for applications with high requirements on linearity and efficiency, such as AB-class amplifiers, the temperature dependence of the drain quiescent current is a problem.

From the American patent publication 6 2 88 596 a gate biasing arrangement for temperature compensation of a quiescent current of a power transistor is known. The arrangement comprises a LDMOSFET with its drain and gate interconnected. The gate and drain of the LDMOSFET are connected to the gate of a LDMOSFET power transistor via either a high resistance resistor or a high inductance inductor. The source of the LDMOSFET and the power LDMOSFET transistor are connected to each other.

The LDMOSFET transistor controls the bias voltage at the gate of the power LDMOSFET such that the power LDMOSFET is compensated for the temperature dependence of the drain quiescent current.

However, this known biasing arrangement is disadvantageous because changes in the device characteristics of the LDMOSFET other than the temperature dependence of the drain quiescent current are not compensated for. Hence, the characteristics of the known biasing arrangement are unstable, for instance during the lifetime of the device due to the degradation of the drain quiescent current.

It is a goal of the invention to provide an amplifier bias circuit which gives an amplifier stable characteristics. This object is according to the invention realized by an amplifier bias circuit connectable to an amplifier device comprising:
at least one first sensor device for sensing a first amplifier characteristic and for providing at a first sensor output a bias signal related to the first amplifier characteristic;
at least one second sensor device for sensing a second amplifier characteristic and for providing at a second sensor output a bias signal related to the second amplifier characteristic;
which first sensor output and second sensor output are each connectable to at least one bias input of said amplifier device.

An amplifier bias circuit according to the invention provides an amplifier device which, if connected to the amplifier bias circuit, has improved characteristics, because the sensor devices sense more than one characteristic and in use compensate the amplifier device via the bias signal for the change in the sensed characteristics.

The invention further provides a method for biasing an amplifier bias circuit and an integrated circuit that comprises an amplifier device, which is connected to at least one amplifier bias circuit. Such a method and an integrated circuit also have stable characteristics, because more than one characteristic is sensed and the amplifier device is compensated via the bias signal for the change in the sensed characteristics. The invention also provides an apparatus comprising at least an amplifier bias circuit.

Specific embodiments of the invention are set forth in the dependent claims. Further details, aspects and embodiments of the invention will be described with reference to the attached drawing.

Figure 1:
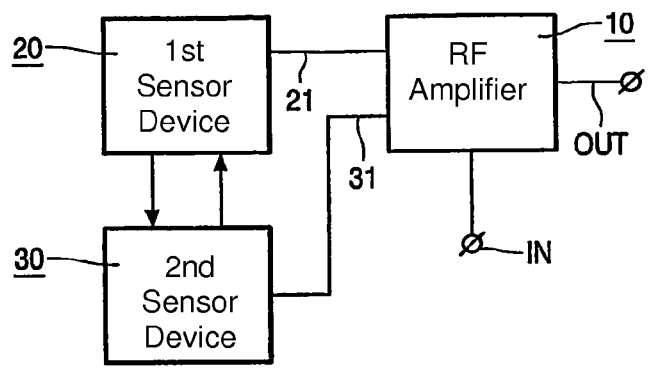
FIG. 1 shows a block diagram of a first example of an amplifier bias circuit according to the invention

The example of FIG. 1 of an amplifier circuit according to the invention comprises a first sensor device 20 and a second sensor device 30 which are both connected to an RF amplifier device 10. The first sensor device 20 is connected to the RF amplifier device 10 via a first bias connection 21. The first sensor device 20 is able to provide the RF amplifier device 10 with a bias signal via the first bias connection 21. The second sensor device 30 is connected to the RF amplifier device 10 via a second bias connection 31 and is able to provide the RF amplifier device 10 with a bias signal via the second bias connection 31. The RF amplifier device 10 has an input IN and an output OUT. At the input IN an RF input signal may be presented to the RF amplifier device 10 and in reaction to the input signal an amplified RF signal may be presented to the output OUT by the RF amplifier device 10.

In use, the first sensor device 20 senses a first characteristic of the RF amplifier device 10, whereas the second sensor device 30 mimics another characteristic of the RF amplifier device 10. In the example, the first sensor device and the second sensor device sense the respective characteristic via a, not shown, thermal connection and an electrical connection 31 respectively. However, the sensor may likewise sense the characteristic via a different connection or sense the characteristic from a different device than the amplifier device which is to be biased. Based on the sensed value of the characteristic to be controlled, the respective sensor device 20 resp. 30 provides the RF amplifier device 10 with a bias signal to compensate for changes in the characteristic. If for example the first sensor device 20 senses a decrease of the temperature of the RF amplifier device 10, the first sensor device 20 sends a bias signal to the RF amplifier device 10 via the first bias connection 21 to compensate for the temperature dependent change of the quiescent output current or if the second sensor device senses a degradation of the quiescent output current, the second sensor device 30 sends a bias signal to increase the bias of the RF amplifier device 10.

The first and second sensor 20,30 are communicatively connected to each other via connections 22,32. Via these connections the first and second sensor 20, 30 may provide each other with information about the sensed characteristic. Thereby, each one of the sensor device 20, 30 can take into account the sensed value of the other sensor to cancel out influences of characteristics not to be sensed by the respective sensor. For example, if both sensors are subject to the same conditions and one of the sensors is for sensing a temperature dependent part of a characteristic, whereas the other sensor is for sensing a time dependent part of the same characteristic, the sensors may exchange information about temperature an/or time dependence to deduct the part of the characteristics which the respective sensor has to sense. This may for example be obtained by implementing the first and second sensor device as a feedback circuit such that the second sensor output is connected to a first sensor input of the first sensor device and the first sensor output is connected to a second sensor input of the second sensor device, such as for example in the circuit according to the invention of FIG. 3.

Figure 2:
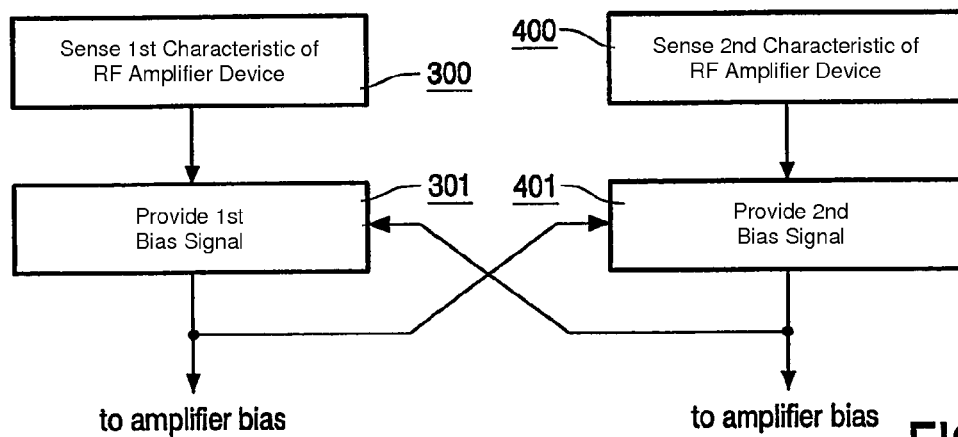
FIG. 2 shows a flow-chart of an example of a biasing method according to the invention.

FIG. 2 shows a flow-chart of an example of a method according to the invention. In step 300 a first characteristic of an RF amplifier device is sensed. In step 301, based on the sensed value of the first characteristic a first bias signal is provided which after step 301 is transmitted to the RF amplifier device to control the bias of the RF amplifier device. In step 400 a second characteristic of the RF amplifier device is sensed. In step 401 based on the sensed value of the second characteristic a second bias signal is provided which after step 401 is transmitted to the RF amplifier device to control the bias of the RF amplifier device as well. Each of the first and second bias signal are also transmitted to the operation of providing the other bias signals in steps 301,401.

The first and second sensor may for example comprise sensing amplifier devices with electrical characteristics which resemble the electrical characteristics of the RF amplifier device to be biased. The sensing amplifiers may then be connected in the circuit in such a manner that one of the sensing amplifiers is not subjected to one of the changes in the characteristics of the RF amplifier device and the other sensor amplifier is subjected to at least partially different changes. For example, one of the sensor amplifiers may be thermally connected to the RF amplifier device and experience degradation changes, while the other sensor amplifier device is only thermally connected to the RF amplifier device. Thus one sensor amplifier characteristics change with time, while the other sensor amplifier characteristics do not. By comparing the characteristics of both sensor amplifier devices, the characteristics of the RF amplifier device connected to the bias circuit can be derived and the bias of the amplifier can be changed in reaction thereto.

Figure 3:
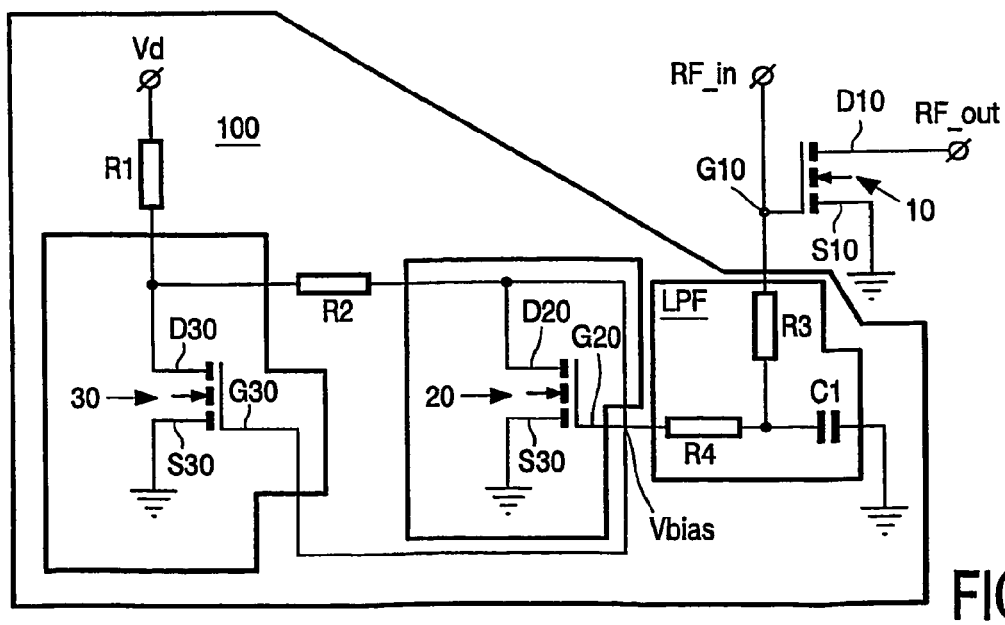
FIG. 3 shows a circuit diagram of an example of an embodiment of an amplifier bias circuit according to the invention.

FIG. 3 shows a circuit diagram of an example of an embodiment of the invention with insulated gate field effect transistors (IGFET). In the shown example, the IGFETs are laterally diffused metal oxide semiconductor field effect transistors (LDMOSFETs). Especially LDMOSFETs are prone to degradation of the drain quiescent current during the lifetime of the transistor due to hot electrons. However, for other types of FETs hot electrons may also cause degradation. Furthermore, FETs, and LDMOSFETs in particular, suffer from a temperature dependent drift in the drain quiescent current.

In the example of FIG. 3, an RF transistor 10, is connected with its source s10 to ground. The drain d10 of the RF transistor 10 is connected to an RF output RF_out. The gate g10 of the RF transistor 10 is connected to an RF input RF_in. The gate g10 is also connected via a low-pass filter LPF to a bias output Vbias of an amplifier bias circuit 100, in the shown example this is the gate g20 of a first sensor transistor 20.

The gate g20 of the first sensor transistor 20 is connected to the drain d20 of the first sensor transistor. The source s20 of the first sensor transistor 20 is connected to ground. The drain d20 of the first sensor transistor 20 is connected to the drain d30 of a second sensor transistor 30 via a resistor R2. The gate g30 of the second sensor transistor 30 is connected to the gate g20 of the first sensor transistor 20. In the shown example, the gate g30 is directly connected to the gate g20, however the gates may also be connected in an indirect manner to each other, for example via a resistor, a low pass filter or otherwise. The source s30 of the second sensor transistor 30 is connected to ground. The drain d30 of the second sensor transistor 30 is connected to a voltage supply Vd via a resistor R1. Both sensor transistors 20,30 are thermally connected to the RF transistor 10.

The drain d20 of the first sensor transistor 20 is directly connected to the gate g20 of the first sensor transistor 20. Thereby, the voltage difference between gate g20 and drain d20 is zero. In a transistor, the gate is physically located between the source and the drain. When there is no voltage difference between gate and drain, then between the gate and the drain no electrical fields are present. Thus, no (high) electrical fields are present in the drain region of the first sensor transistor. Hence, in the drain region there will be almost no high energy charge carriers and therefore almost no degradation of the drain quiescent current of the first sensor transistor 20.

Instead of a direct connection, the gate and drain of the first sensor transistor 20 may be connected to each other via a low-impedance device,. The low-impedance device may be any suitable device, such as a low-pass filter and for example comprise passive devices such as a resistor, capacitor or inductor.

In the example of FIG. 3, the amplifier bias circuit 100 compensates the bias voltage of the RF amplifier device, e.g. of the RF transistor 10, for the degradation of the drain quiescent current and the temperature dependent change of the drain current. The first sensor transistor 20 provides a bias voltage at its gate g20 to both the second sensor transistor 30 and the RF transistor 10. The first sensor transistor 20 is thermally connected to the RF transistor 10 and therefore has substantially the same temperature as the RF transistor 10. The drain-source current of the first sensor transistor is substantially constant as a function of the temperature, due to the strong negative voltage feed-back created by the gate to drain connection. Hence, if the temperature of the amplifier changes, the temperature of the first sensor transistor 20 changes. Since the current through the first sensor transistor is constant with temperature, the voltage between the gate g20 and the source s20 changes and hence the voltage bias of the RF transistor 10.

In contrast to the first sensor transistor 20, the second sensor transistor 30 does experience a degradation during lifetime due to hot charge carriers similar to the degradation of the RF transistor 10. The second sensor transistor 30 experiences a degradation of the drain quiescent current because, in use, a voltage difference exists between the gate g30 and the drain d30. The voltage at the gate g30 of the second sensor transistor is controlled by the first sensor transistor 20. Hence, the second sensor transistor is, like the RF transistor 10, compensated by the first sensor transistor 20 for the temperature dependent drift of the quiescent drain current.

When during the lifetime of the RF amplifier device 10 and the bias circuit 100 the second sensor transistor 30 experiences a degradation of the drain quiescent current, the current flow through the second sensor transistor 30 reduces. Therefore, the current through the resistor R1 reduces and the voltage drop over the resistor R1 lowers. This lower voltage drop of resistor R1 causes an increase of the voltage of the node between the resistor R1 and the second sensor transistor 30, i.e. the voltage of the drain d30. This voltage change is transferred to the gate g20 through R2 and the drain-gate connection and the voltage at this point also increases proportionally establishing new bias point for the first sensor transistor 20. Hence the bias voltage of the amplifier 10 is increased. Thus, the amplifier 10 is compensated by the second sensor transistor 30 for the degradation of the quiescent current from the drain to the source. Thereby, the voltage at the bias voltage contact Vbias is such that the RF transistor 10 is compensated both for temperature drift and for degradation of the drain quiescent current.

For obtaining a good thermal coupling between the first sensor transistor and the RF transistor, the transistors may be situated in close proximity and for example be implemented as an integrated circuit. If the integrated is a single crystal integrated circuit a good thermal coupling between the elements is obtained. The single crystal integrated circuit may for example be a monolithic microwave integrated circuit (MMIC).

The gate g10 of the RF amplifier device 10 is connected to the RF input RF_in. A non-DC signal may be presented at the RF input RF_in. The non-DC signal is then amplified by the RF amplifier device 10. The amplified non-DC signal is then presented via the drain d10 to the RF output RF_out.

In the example of FIG. 3, the gate g10 of the RF amplifier device 10 is connected to the bias output Vbias of the amplifier bias circuit 100 via an RF-decoupler device, in this example a low-pass filter LPF. In the example, the low pass filter comprises two resistors R3,R4 connected in series. The resistors R3,R4 connect the bias output Vbias to the gate of the RF amplifier device 10. The node between the resistors R3,R4 is connected to ground via a capacitor C1.

The low-pass filter LPF decouples the RF amplifier device 10 from the amplifier bias circuit for high-frequency signals. Thus, the RF-signal presented at the RF input is prevented from entering the bias circuit 100. Thereby, interference of the signal presented at the RF input with signals in the amplifier bias circuit is prevented. However, the low-pass filter may be omitted in a circuit according to the invention. Furthermore, instead of the filter in FIG. 3, other filters may be used, for example an active filter comprising at least one amplifier device may be used or a passive filter with one or more inductors.

Figure 4:
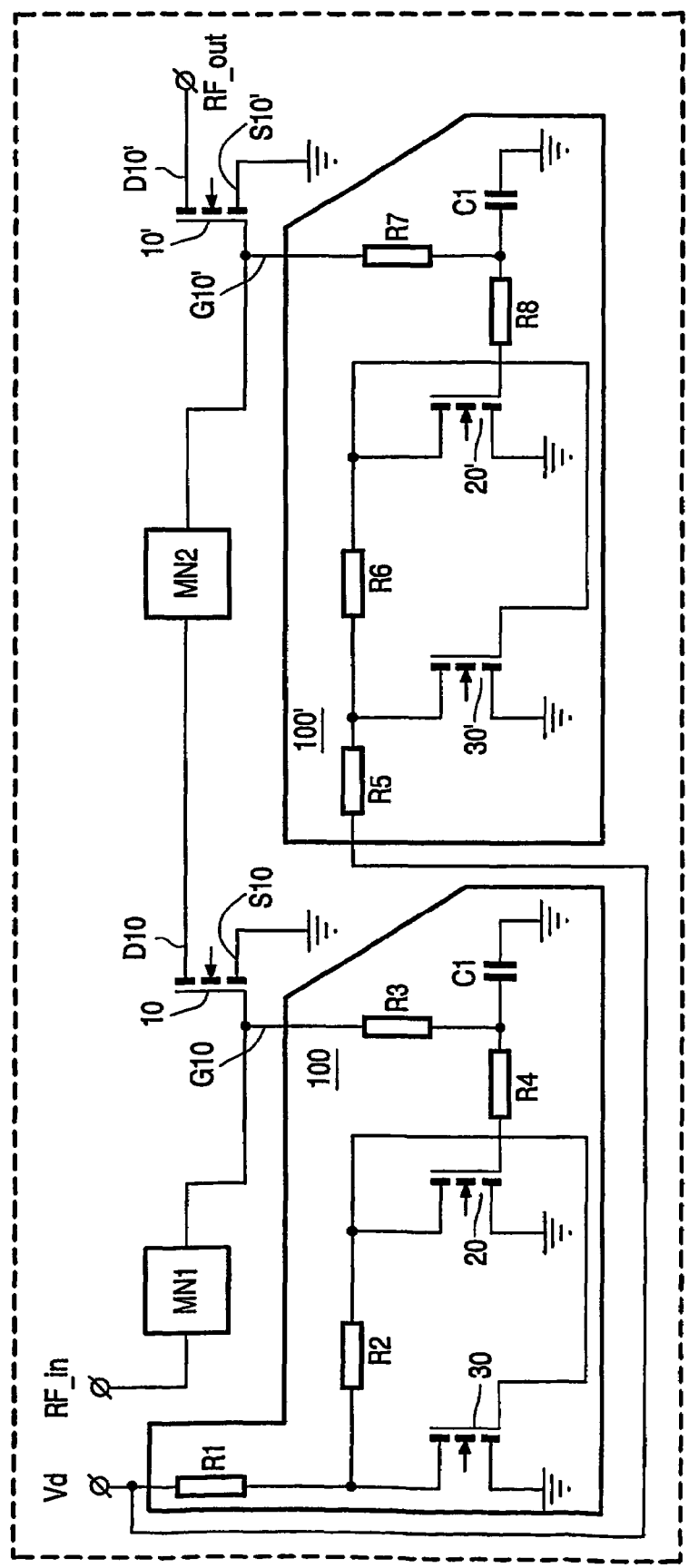
FIG. 4 shows a circuit diagram of a second example of an embodiment of an amplifier bias circuit according to the invention.

FIG. 4 shows a circuit diagram of an example of an integrated circuit according to the invention. The circuit comprises two RF amplifier devices 10,10'. The RF amplifier device 10 is connected to an amplifier bias circuit 100 with the gate g10. The RF amplifier device 10' is also connected to an amplifier bias circuit 100' according to the invention with its gate g10'. The RF amplifier device 10' is connected with the gate g10' to the drain d10 of the RF amplifier device 10 via a matching circuit MN2. The drain d10' of the RF amplifier device 10' forms an RF output Rf_out of the integrated circuit. The RF amplifier device 10 is connected with the gate to an RF-input RF_in via a matching circuit MN1. The sources s10, s10' of the RF amplifier devices 10,10' are connected to ground. The amplifier bias circuits 100,100' are connected to a voltage source Vd. The matching circuits MN1, MN2 are arranged to match the impedance of the circuits.

In use, at the RF-input Rf_in a signal may be presented to the RF amplifier device 10. The RF amplifier 10 amplifies the signal and presents the amplified signal via the matching circuit MN2 to the RF amplifier device 10' which amplifies the amplified signal and transmits the signal further to the RF-output. Each of the amplifier bias circuits 100,100' is similar to the example of a circuit of FIG. 3. Thus the circuit 100 provide the RF amplifier device 10 with a compensating bias signal and the circuit 100' provide the RF amplifier device 10' with a compensating bias signal. Therefore, the amplifier bias circuits 100,100' compensate the RF amplifier devices 10,10' for degradation and temperature drift of the drain quiescent current.

The invention is not limited to the described examples. After the above, several modifications should be apparent. In particular, it should be apparent that the RF amplifier device could be provided with a bias current instead of a bias voltage. Furthermore, in the example of FIG. 3, the drains and sources of the transistors may be interchanged, which makes the amplifier circuit compensate for degradation and drift of the source current. Further, it should be apparent that two or more RF amplifier devices may be connected to a single amplifier bias circuit according to the invention. For instance, in the example of FIG. 3, two or more RF-transistors may be connected to the RF-input RF_in. Further, two or more RF amplifier devices may be connected to a single bias circuit according to the invention. Also, it should be apparent that resistors, capacitors, and inductors may be changed for devices with similar characteristics. Furthermore, the sensor device which experiences degradation of the drain quiescent current may be implemented such that is has a similar or higher degradation compared to the RF amplifier device degradation rate of the drain quiescent current, for example by implementing the sensor device as a transistor with modified characteristics such as gate length and/or drain extension.

The invention claimed is:

1. An amplifier bias circuit connectable to an amplifier device, comprising:
    at least one first sensor device for sensing a first amplifier characteristic and for providing, at a first sensor output, a bias signal related to the first amplifier characteristic;
    at least one second sensor device for sensing a second amplifier characteristic and for providing, at a second sensor output, a bias signal related to the second amplifier characteristic;
    which first sensor output and second sensor output are each connectable to at least one bias input of said amplifier device; and
   wherein the first sensor device and the second sensor device are communicatively connected to each other and are able to provide each other with a signal related to the sensed characteristic.

2. An amplifier bias circuit as claimed in claim 1, wherein the first sensor device is for sensing a lifetime dependent characteristic of the amplifier device.

3. An amplifier bias circuit as claimed in claim 1, wherein the second sensor device is for sensing a temperature dependent characteristic of the amplifier device.

4. An amplifier bias circuit as claimed in claim 1, wherein the second sensor device and the first sensor device are connected to each other as a feedback circuit, such that the second sensor output is connected to a first sensor input of the first sensor device and the first sensor output is connected to a second sensor input of the second sensor device.

5. An amplifier bias circuit as claimed in claim 1, wherein the first sensor output and the second sensor output are connected to an RF-decoupling device, which RF-decoupling device is connectable to the bias input.

6. An amplifier bias circuit as claimed in claim 5, wherein the RF-decoupling device comprises a low-pass filter.

7. An amplifier bias circuit as claimed in claim 6, wherein the low-pass filter comprises at least two resistor devices in series and the low-pass filter further comprises a capacitor device connecting a node between the at least two resistor devices to ground.

8. An amplifier bias circuit according to claim 1, wherein the first sensor device comprises a first sensor transistor with at least one voltage input and at least two current outputs, and which voltage input is connected to at least one of the current outputs such that in use the voltage difference between the input and the output connected thereto is small.

9. An amplifier bias circuit as claimed in claim 8, wherein the first sensor transistor is connectable to the amplifier device to form a current mirror circuit.

10. An amplifier bias circuit according to claim 1. wherein the second sensor device comprises:
    a second sensor transistor thermally connectable to the amplifier device, which second sensor transistor has
    at least one voltage input and
    at least two current outputs,
    wherein use a voltage difference between the voltage input and at least one of the current outputs exists.

11. An amplifier bias circuit according to claim 1. wherein at least one of the sensors devices comprises a field effect transistor.

12. An amplifier bias circuit according to claim 1. wherein at least one of the sensor devices comprises an insulated gate field effect transistor.

13. An amplifier bias circuit as claimed in claim 12, wherein at least one of the insulated gate field effect transistors is a laterally diffused metal oxide semiconductor field effect transistor.

14. An amplifier bias circuit according to claim 1, wherein the amplifier bias circuit and the amplifier device are implemented on a single integrated circuit.

15. An amplifier bias circuit according to claim 1, wherein at least one of the sensor devices has at least one characteristic which corresponds to at least one of said amplifier characteristics.

16. An integrated circuit comprising an amplifier device which is connected to at least one amplifier bias circuit, the amplifier bias circuit comprising:
    it at least one first sensor device for sensing a first amplifier characteristic and for providing at a first sensor output a bias signal related to the first amplifier characteristic;
    at least one second sensor device for sensing a second amplifier characteristic and for providing at a second sensor output a bias signal related to the second amplifier characteristic;
    which first sensor output and second sensor output are each connectable to at least one bias input said amplifier device, and
    wherein the first sensor device and the second sensor device are communicatively connected to each other and are able to provide each other with a signal related to the sensed characteristic.

17. An integrated circuit as claimed in claim 16 wherein the integrated circuit is a single crystal integrated circuit.

18. Apparatus comprising an amplifier bias circuit connectable to an amplifier device, the amplifier bias circuit comprising:
    at least one first sensor device for sensing a first amplifier characteristic and for providing at a first sensor output a bias signal related to the first amplifier characteristic;
    at least one second sensor device for sensing a second amplifier characteristic and for providing at a second sensor output a bias signal related to the second amplifier characteristic;
    which first sensor output and second sensor output are each connectable to at least one bias input said amplifier device, and
    wherein the first sensor device and the second sensor device are communicatively connected to each other and are able to provide each other with a signal related to the sensed characteristic.

* * * * *